(12) United States Patent
Akimoto

(10) Patent No.: US 6,464,789 B1
(45) Date of Patent: Oct. 15, 2002

(54) SUBSTRATE PROCESSING APPARATUS

(75) Inventor: Masami Akimoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 142 days.

(21) Appl. No.: 09/589,404

(22) Filed: Jun. 8, 2000

(30) Foreign Application Priority Data

Jun. 11, 1999 (JP) .......................................... 11-165099

(51) Int. Cl.[7] .......................... B05C 11/00; C23C 16/00; B65G 49/07
(52) U.S. Cl. .......................... 118/666; 118/712; 118/66; 118/69; 118/724; 414/935
(58) Field of Search ............................... 118/66, 52, 58, 118/59, 320, 69, 666, 712, 724, 725; 427/240; 414/222.01, 941, 939, 935

(56) References Cited

U.S. PATENT DOCUMENTS

| | | | | |
|---|---|---|---|---|
| 5,620,560 A | * | 4/1997 | Akimoto et al. | 216/41 |
| 5,762,745 A | * | 6/1998 | Hirose | 156/345 |
| 6,215,545 B1 | * | 4/2001 | Matsuyama | 355/30 |
| 6,264,381 B1 | * | 7/2001 | Ueda | 396/604 |
| 6,287,025 B1 | * | 9/2001 | Matsuyama | 396/611 |

FOREIGN PATENT DOCUMENTS

JP 10-74818 3/1998

* cited by examiner

Primary Examiner—Richard Crispino
Assistant Examiner—Kevin P. Shortsle
(74) Attorney, Agent, or Firm—Oblon, Spivak, McClelland, Maier & Neustadt, P.C.

(57) ABSTRACT

A cooling processing unit for cooling a wafer to a predetermined temperature is disposed between a heat processing unit and a set of a resist coating processing unit and a developing processing unit. Pre-cooling units are stacked in multi-stages on top of the cooling processing unit. Immediately after having undergone heat processing in the heat processing unit, the wafer is first transferred to the pre-cooling unit by a first transfer machine. Thereafter, the wafer is transferred to the cooling processing unit by a third transfer machine to be cooled to the predetermined temperature, and then transferred to the resist coating processing unit by a second transfer machine. Thus, over-bake of the wafer can be prevented.

20 Claims, 9 Drawing Sheets

SUBSTRATE PROCESSING APPARATUS

CROSS-REFERENCE TO RELATED APPLICATIONS

This application is based upon and claims the benefit of priority from the prior Japanese Patent Applications No. 11-165099, filed Jun. 11, 1999, the entire contents of which are incorporated herein by reference.

BACKGROUND OF THE INVENTION

The present invention relates to a substrate processing apparatus.

In lithography in manufacturing semiconductor devices, for example, a resist solution is applied to the front face of a substrate such as a semiconductor wafer (hereinafter referred to as "wafer") or the like to form a resist film, a pattern is exposed, and thereafter a developing solution is supplied to the substrate to perform developing processing for the substrate. To perform such a series of processes, hitherto a substrate processing apparatus has been used.

The substrate processing apparatus includes a resist coating processing unit for coating a wafer with a resist solution and processing it, a heat processing unit for subjecting the wafer which has undergone the resist coating processing or exposure processing to heat processing, a cooling processing unit for subjecting the wafer which has undergone the heat processing to cooling processing to a predetermined temperature, a developing processing unit for supplying a developing solution to the wafer to perform developing processing, and the like individually. The wafer is transferred between these processing units and carried in and out by a transfer machine.

Incidentally, there is a possibility that failure in processing due to excessive heat processing for the wafer, that is, so-called over-bake arises if the wafer which has undergone heat processing is not cooled immediately. Hence, conventionally, in order to promptly remove heat stored in the wafer which has undergone heat processing, each tact time of the heat processing unit and the transfer unit is regulated so that the transfer machine is waiting in the heat processing unit before heat processing for the wafer is completed, and thus the transfer machine can immediately transfer the wafer which has just undergone heat processing to the cooling processing unit.

When the carrying out of the wafer which has already undergone cooling processing from the cooling processing unit is delayed for some reason, another wafer which has undergone heat processing can not be immediately carried into this cooling processing unit. As a result, the wafer which has undergone the heat processing merely waits as it is without being carried into the cooling processing unit, thereby causing a possibility that failure in processing due to over-bake occurs.

BRIEF SUMMARY OF THE INVENTION

An object of the present invention is to provide a substrate processing apparatus capable of preventing failure in processing due to over-bake of a substrate which has already undergone heat processing.

To attain this object, the present invention provides a substrate processing apparatus comprising a solution processing unit configured to supply a processing solution to a substrate for processing the substrate, a cooling processing unit configured to subject the substrate to cooling processing to a predetermined temperature, a heat processing unit configured to subject the substrate to heat processing, and a pre-cooling unit configured to cool the substrate before the substrate is subjected to the cooling processing to the predetermined temperature.

According to the present invention, before being carried into the cooling processing unit, the substrate which has just carried out of the heat processing unit is carried into the pre-cooling unit to be cooled. Accordingly, even when the next substrate which has just undergone heat processing can not be carried into the cooling processing unit since cooling processing for the former substrate is not yet completed in the cooling processing unit, the next substrate can be carried into the pre-cooling unit and cooled to such a degree that over-bake does not arise. As for pre-cooling of the substrate, the substrate may be cooled by proper cooling means such as temperature regulated water, Peltier elements, and the like, and in addition to this, for example, the substrate may be cooled by natural cooling.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A substrate processing apparatus according to a preferred embodiment of the present invention will be explained below.

Figure 1:
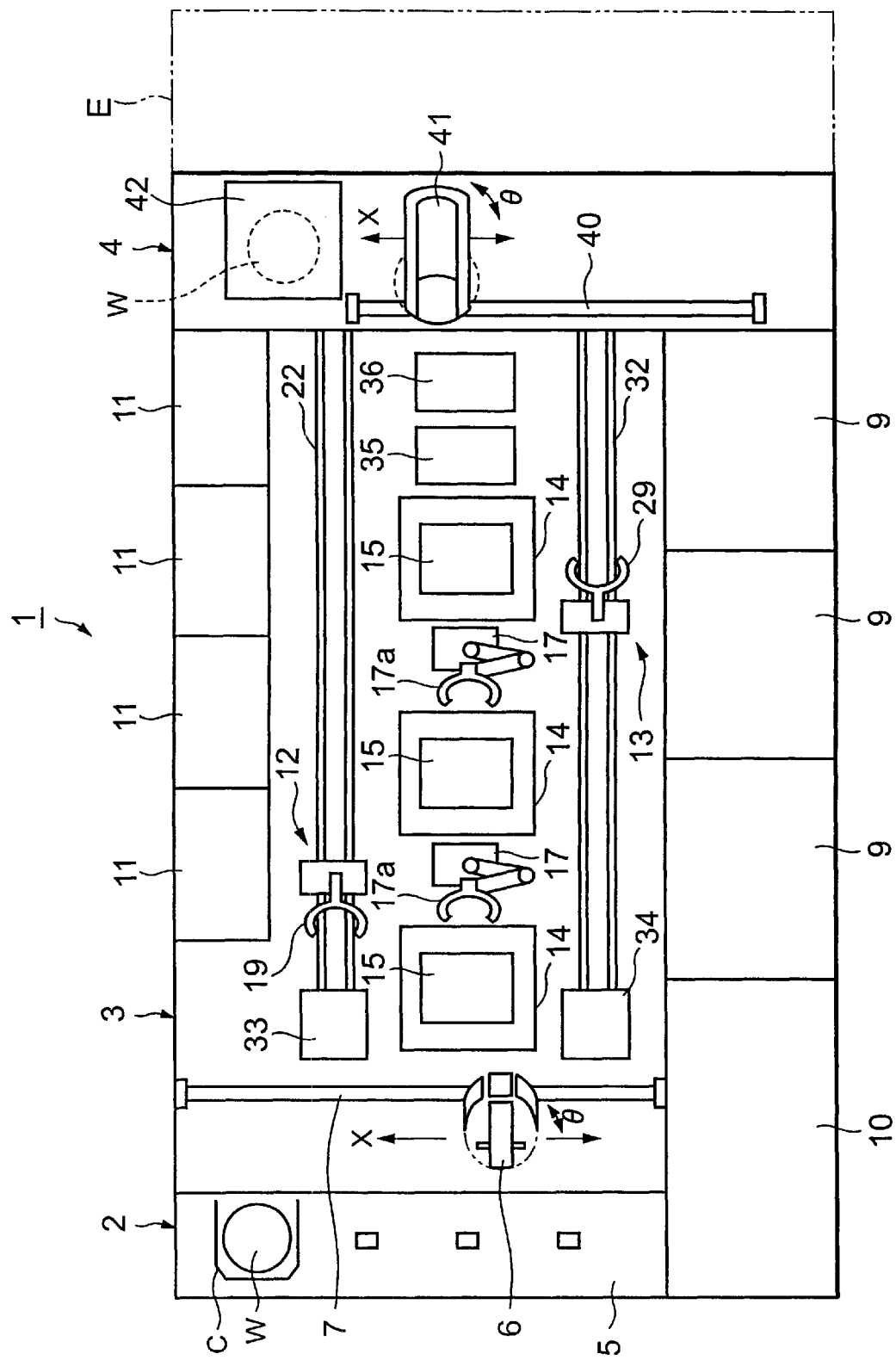
FIG. 1 is a schematic plan view of a substrate processing apparatus according to an embodiment of the present invention.

AS shown in FIG. 1, the substrate processing apparatus 1 has a structure in which a cassette station 2 for transferring, for example, 25 wafers W per cassette, as a unit, from/to the outside into/from the substrate processing apparatus 1 and carrying the wafer W into/out of a cassette C, a processing station 3 in which various kinds of processing units each performing predetermined processing for the wafers W one by one are disposed, and an interface section 4 for delivering the wafer W from/to an aligner E for exposing the wafer W are integrally connected.

In the cassette station 2, the cassettes C can be freely mounted with respective transfer ports for the wafer W facing the side of the processing station 3 at predetermined positions on a cassette mounting table 5 in an X-direction (a vertical direction in FIG. 1). A wafer transfer body 6 movable in the direction of arrangement of the cassettes C (the X-direction) and in the direction of arrangement of the wafers W housed in the cassette C (a Z-direction, i.e., a vertical direction) is movable along a transfer path 7. The wafer transfer body 6 is also rotatable in a θ-direction (the direction of rotation around a Z-axis) so as to be selectively accessible to each of the cassettes C.

Figure 2:
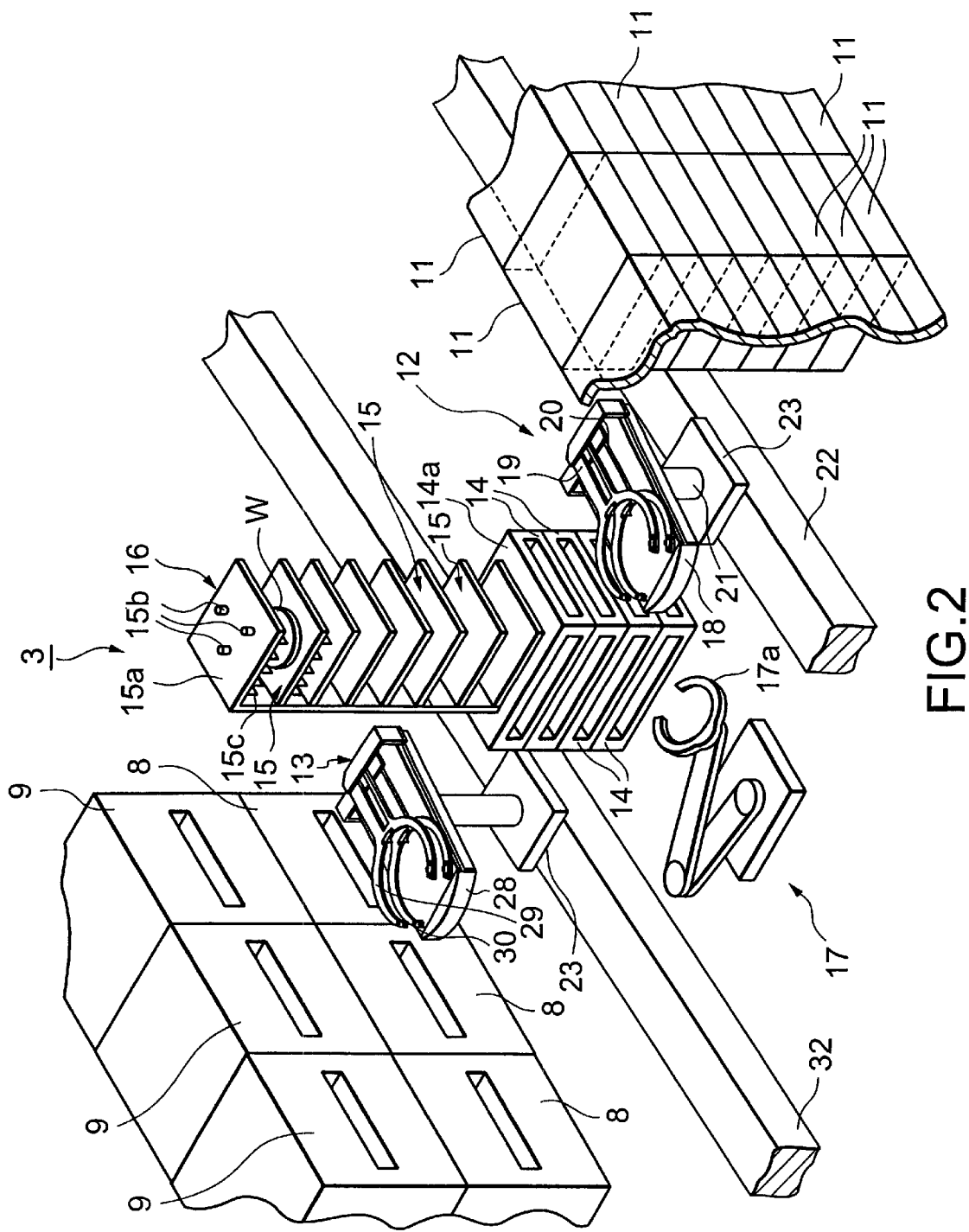
FIG. 2 is a perspective view showing a processing station of the substrate processing apparatus in FIG. 1.

As shown in FIGS. 1 and 2, various kinds of processing units each performing predetermined processing for the wafer W are arranged in the processing station 3. Specifically, on the front side of the processing station 3, three resist coating processing units 8 and three developing processing units 9 are arranged in two stages from the bottom in order. The resist coating processing units 8 each applies a resist solution to the rotating wafer W for processing the wafer W. The developing processing units 9 each supplies a developing solution to the rotating wafer W for processing the wafer W. A chemical box 10 capable of housing a resist solution supply tank and other equipment is provided on the cassette station 2 side.

On the rear side of the processing station 3, various kinds of heat processing units 11 for performing heat processing for the wafer W are arranged in eight stages with four units being arrayed. The heat processing units 11 include an adhesion unit for improving adherence of the wafer W and a resist film, a pre-baking unit for performing heat processing for the wafer W which has undergone resist coating processing, post-exposure baking units for performing heat processing for the wafer W which has undergone exposure processing, a post-baking unit for performing heat processing for the wafer W which has undergone developing processing, and the like.

Provided between a set of the resist coating processing units 8 and the developing processing units 9 and a set of the heat processing units 11 are a first transfer machine 12 and a second transfer machine 13 each transferring the wafer W, cooling processing units 14 each subjecting the wafer W to cooling processing to a predetermined temperature, pre-cooling units 15 each cooling the wafer W before the cooling processing in the cooling processing units 14, third transfer machines 17 each transferring the wafer W between the cooling processing unit 14 and the pre-cooling unit 15, and mounting tables 33, 34, 35, and 36 on each of which the wafer W can be freely mounted.

Figure 3:
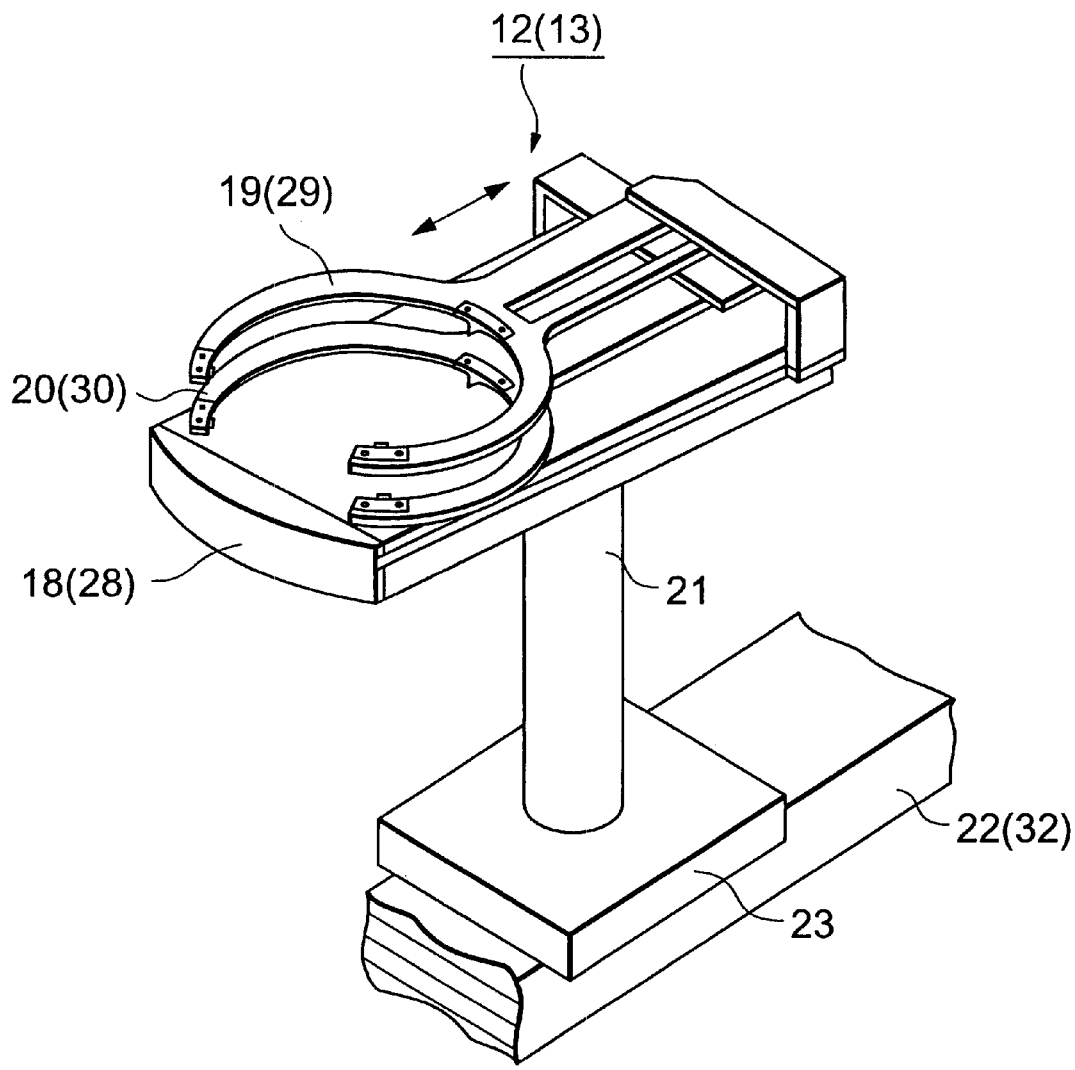
FIG. 3 is a perspective view of a first transfer machine provided in the processing station in FIG. 2.

The first transfer machine 12 and the second transfer machine 13 have basically the same structure, and if the structure of the first transfer machine 12 will be explained, as shown in FIG. 3, the first transfer machine 12 vertically includes tweezers 19 and 20 capable of holding the wafer W on a transfer base 18, and the tweezers 19 and 20 are movable back and forth independently of each other by a proper motor (not illustrated) contained in the transfer base 18. The transfer base 18 is provided on an ascent/descent shaft 21 which is ascendable and descendable, and rotatable, and the ascent/descent shaft 21 itself is provided on a moving base 23 which is movable along a transfer rail 22. The second transfer machine 13 also vertically includes tweezers 29 and 30 on a transfer base 28:and it is movable along a transfer rail 32 disposed parallel to the transfer rail 22.

The mounting tables 33 and 34 on each of which the wafer W can be freely mounted are respectively provided at end portions of the transfer rails 22 and 32 on a side of the cassette station 2. The first transfer machine 12 can perform the transfer of the wafer W from/to the wafer transfer body 6 via the mounting table 33, and the second transfer machine 13 can perform the transfer of the wafer W from/to the wafer transfer body 6 via the mounting table 34.

The cooling processing units 14 are stacked in four stages. The cooling processing unit 14 is structured to cool the wafer W carried into a casing 14a to the predetermined temperature. Therefore, the cooling processing unit 14 has a chill plate in which a cooling pipe for supplying Peltier elements or cooling water and the like are embedded and on which the wafer W is mounted in the casing 14a. Since the cooling processing unit 14 has such members, it is possible to distinguish the cooling processing unit 14 from the pre-cooling unit 15. The pre-cooling units 15 are stacked in eight stages on the topmost cooling processing unit 14. As shown in FIG. 2, the pre-cooling unit 15 comprises a plate 15a made of a material with good thermal conductivity, for example, aluminum, three supporting pins 15b provided on the plate 15a as supporting members for supporting the wafer W, and radiation fins 15c as a radiation mechanism provided on the lower face of the plate 15a. A cooling processing unit group 16 comprises these multi-tiered cooling processing units 14 and pre-cooling units 15. Three cooling processing unit groups 16 are arranged along the lengthwise directions of the transfer rails 22 and 32. The heat processing units 11 and the cooling processing unit groups 16 are disposed facing each other across the first transfer machine 12. The resist coating processing units 8 and the developing processing units 9 on one side and the cooling processing unit groups 16 on the other side are disposed facing each other across the second transfer machine 13.

The third transfer machine 17 is disposed between the adjoining cooling processing unit group 16 and cooling processing unit group 16. The third transfer machine 17 is constructed so as to move ascendably and descendably, and extendibly and contractibly with the wafer W being held by tweezers 17a, so that the transfer machine 17 can transfer the wafer W between the cooling processing unit 14 and the pre-cooling unit 15.

The mounting tables 35 and 36 having basically the same structure as the mounting tables 33 and 34 are arranged side by side along the lengthwise directions of the transfer rails 22 and 32 in the vicinity of the cooling processing unit group 16 disposed closest to the interface section 4 and the interface section 4. These mounting tables 35 and 36 may have a vertically multi-tiered structure. The first transfer machine 12 can transfer the wafer W to the heat processing units 11, the pre-cooling units 15, and the mounting tables 35 and 36. The second transfer machine 13 can transfer the wafer W to the resist coating processing units 8, the developing processing units 9, the cooling processing units 14, and the mounting tables 35 and 36.

A wafer transfer body 41 movable in the X-direction along a transfer rail 40 and the Z-direction, and rotatable in the θ-direction is provided in the interface section 4. The wafer transfer body 41 can transfer the wafer W to the aligner E, the mounting table 36, and a peripheral aligner 42.

The substrate processing apparatus 1 according to the embodiment of the present invention is structured as above, and operational effects and the like thereof will be explained below.

When the cassette C housing unprocessed wafers W is mounted on the cassette mounting table 5, the wafer transfer body 6 pulls out one wafer W from the cassette C, and the wafer W which is pulled out is first mounted on the mounting table 33. Subsequently, the wafer W is transferred to an alignment unit and an adhesion unit in this order by the first transfer machine 12 and undergoes predetermined processing. In this case, the alignment unit may serve as the mounting table 33. As for the adhesion unit, the processing usually involves heat processing, and hence part of a large number of heat processing units 11 may be allowed to have an adhesion processing function.

Thereafter, the wafer W is transferred to the pre-cooling unit 15 while being held by the tweezers 19 of the first transfer machine 12. The wafer W is then carried into the pre-cooling unit 15, and naturally cooled while being supported by the supporting pins 15b as shown by a full line in FIG. 4. The wafer W is cooled to a temperature at which over-bake does not occur by the aforesaid pre-cooling. Thereafter, the pre-cooled wafer W is transferred to the cooling processing unit 14 by the third transfer machine 17 and undergoes cooling processing until the temperature of the wafer W reaches the predetermined temperature.

The wafer W which has been subjected to the cooling processing to the predetermined temperature is transferred to the resist coating processing unit 8 by the second transfer machine 13, and predetermined resist coating processing is performed there. The wafer W coated with a resist is then transferred to the mounting table 35 by the second transfer machine 13, and then transferred from the mounting table 35 to the heat processing unit 11 by the first transfer machine 12 and subjected to pre-baking processing. Subsequently, after undergoing predetermined cooling processing again in the pre-cooling unit 15 and the cooling processing unit 14, the wafer W is transferred to the mounting table 36, then delivered to the wafer transfer body 41, and transferred to the aligner E by way of the peripheral aligner 42, and undergoes exposure processing of a pattern there.

The wafer W which has undergone the exposure processing in the aligner E is transferred to the mounting table 36, thereafter transferred to the heat processing unit 11 by the first transfer machine 12, and subjected to post-exposure baking processing. Subsequently, after transferred to the pre-cooling unit 15 by the first transfer machine 12 and pre-cooled, the wafer W is transferred to the cooling processing unit 14 by the third transfer machine 17. The wafer W subjected to cooling processing to the predetermined temperature is transferred to the developing processing unit 9 by the second transfer machine 13 to undergo developing processing, and thereafter transferred to the mounting table 35. The wafer W is transferred to the heat processing unit 11 again by the first transfer machine 12, and subjected to post-baking processing.

The wafer W which has undergone the post-baking processing is transferred to the pre-cooling unit 15 by the first transfer machine 12, then transferred to the cooling processing unit 14 by the third transfer machine 17, and cooled to the predetermined temperature. The wafer W cooled to the predetermined temperature is transferred to the mounting table 34 by the second transfer machine 13. After transferred from the mounting table 34 to the cassette C by the wafer transfer body 6, the wafer W is housed in the cassette C. Thus, a series of processing for the wafer W is completed.

As described above, in the substrate processing apparatus 1 according to the embodiment of the present invention, immediately after undergoing processing involving heating such as adhesion processing, post-exposure baking processing, post-baking processing, and the like and heat processing in the heat processing unit 11, the wafer W is first transferred to the pre-cooling unit 15 by the first transfer machine 12 to be pre-cooled. The wafer W is then transferred to the cooling processing unit 14 by the third transfer machine 17 to undergo cooling processing to the predetermined temperature. Therefore, the wafer W which has just undergone heat processing can be promptly cooled to such a temperature that at least over-bake does not arise, thereby making it possible to prevent failure in processing due to over-bake. The radiation fins 15c are provided in the pre-cooling unit 15, whereby the cooing efficiency of the wafer W is improved, and the pre-cooling unit 15 is structurally simplified.

After thus cooled to the predetermined temperature, the wafer W is to be transferred to a solution processing unit such as the resist coating processing unit 8, the developing processing unit 9, or the like by the second transfer machine 13. Accordingly, the second transfer machine 13 transfers only the wafer W which has been cooled to the predetermined temperature and does not transfer the high-temperature wafer W which has been just heated. Hence, resist coating processing sensitive to temperature can be suitably performed.

The transfer of the wafer W is shared among the first transfer machine 12, the second transfer machine 13, and the third transfer machines 17, whereby the share of wafer transfer of the first transfer machine 12 is reduced. Consequently, delay in transfer of the wafer W immediately after the completion of heat processing by the first transfer machine 12 can be prevented, thus more certainly preventing occurrence of failure in the processing of the wafer W due to over-bake.

Further, the cooling processing units 14 and the pre-cooling units 15 are arranged between the resist coating processing units 8 and the developing processing units 9, and the heat processing units 11, which makes it possible to prevent heat from the heat processing units 11 from being transmitted to the resist coating units 8 and the developing processing units 9. As a result, predetermined solution processing sensitive to temperature such as resist coating processing or the like can be suitably performed.

Furthermore, the pre-cooing units 15 are stacked in eight stages on top of the four-stacked cooling processing units 14, thereby reducing occupied floor space. The pre-cooling unit 15 itself is basically constituted by the plate 15a, and thus the number of the pre-cooling units incorporated in the substrate processing apparatus 1 can be increased.

Although the dedicated third transfer machine 17 is assigned to transfer of the wafer W between the pre-cooling unit 15 and the cooling processing unit 14 in the aforesaid embodiment, the first transfer machine 12 itself may be structured to transfer the wafer W between the pre-cooling unit 15 and the cooling processing unit 14 instead of adding the third transfer machines 17. Thus, the structure of the entire substrate processing apparatus 1 can be simplified, thereby enabling effective use of configuration space.

Although the aforesaid embodiment is explained with the given examples in which the pre-cooling units 15 are stacked on top of the cooling processing units 14, it is naturally possible in the present invention to arrange the cooling processing units 14 and the pre-cooling units 15 side by side.

Figure 5:
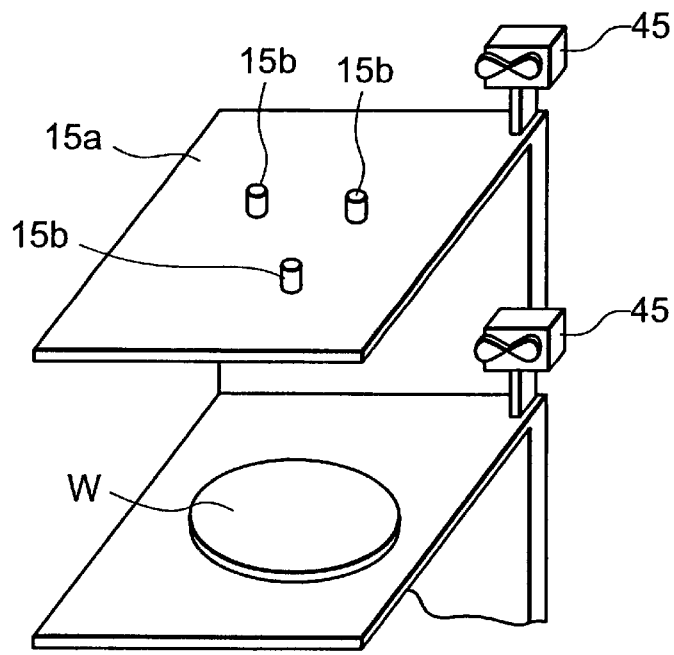
FIG. 5 is a perspective view showing the pre-cooling unit provided with a cooling fan.
Figure 6:
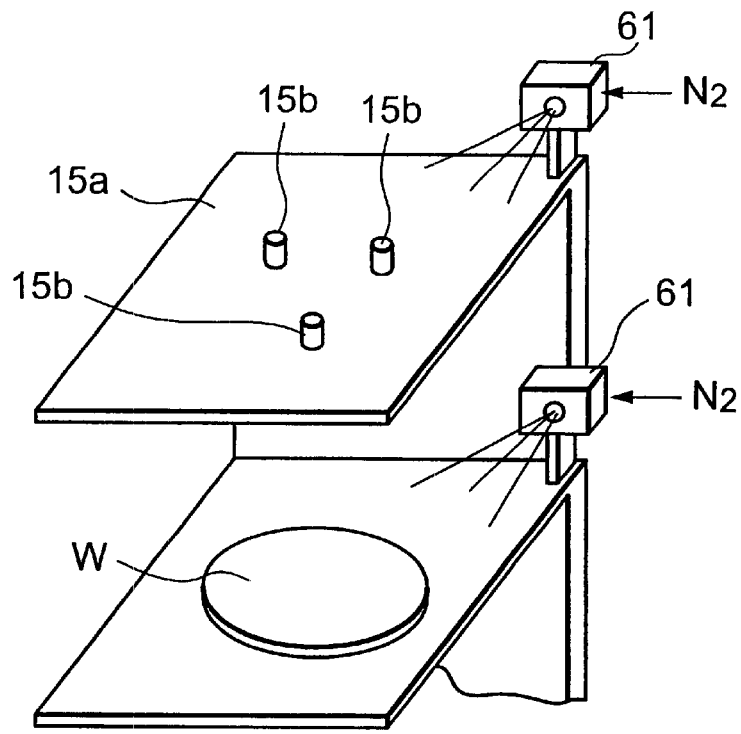
FIG. 6 is a perspective view showing the pre-cooling unit provided with an N2 blower.
Figure 7:
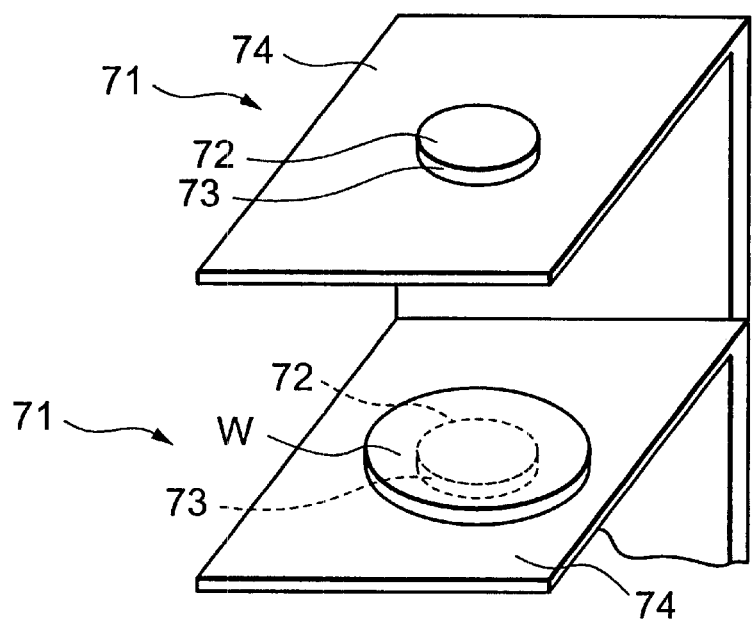
FIG. 7 is a diagram showing another structural example of the pre-cooling unit.

Further, a radiation mechanism provided in the pre-cooling unit 15 is not limited to the radiation fins 15c, but it may be a cooling fan 45 as shown in FIG. 5. In this case, the wafer W can be cooled by air sent from the cooling fan 45, whereby occurrence of failure in processing due to over-bake can be prevented similarly. Moreover, it is possible to improve further cooling effect by combining the radiation fins 15c and the cooling fan 45. As shown in FIG. 6, in place of the cooling fan 45, a gas jetting section 61 for jetting inert gas, for example, N2 gas toward the wafer W may be provided in the pre-cooling unit 15, whereby the wafer W can be effectively cooled similarly.

Although the pre-cooling unit 15 has the plate on which three supporting pins as supporting members for supporting the wafer W are provided in the aforesaid embodiment, a pre-cooling unit 71 may have a supporter 73 having a supporting surface 72 for supporting the center and a portion around the center of the wafer W on a plate 74. Thus, radiation effect by using the supporter 73 can be expected.

Figure 4:
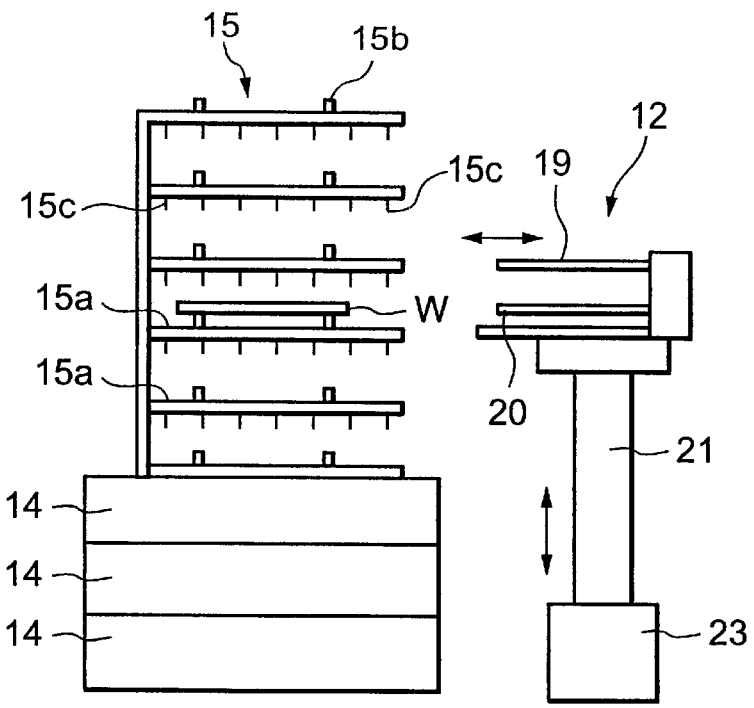
FIG. 4 is an explanatory view showing pre-cooling units tiered on a first cooling processing unit group.
Figure 8:
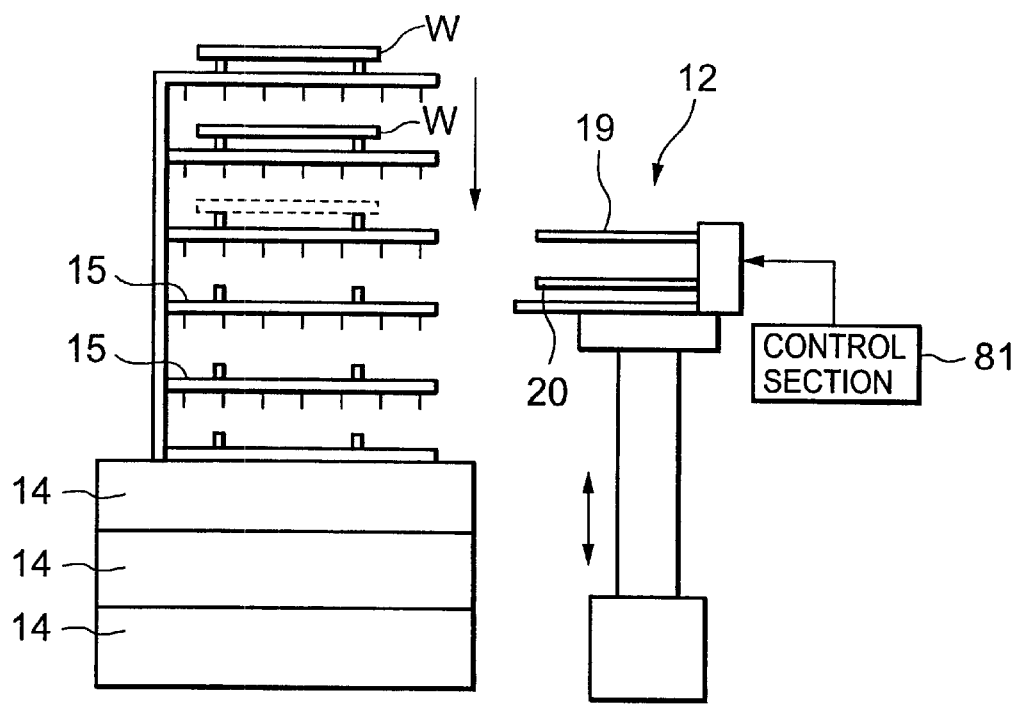
FIG. 8 is a diagram for explaining transfer control to the pre-cooling units.

The pre-cooling units 15 are stacked in multi-stages as shown in FIG. 4. As shown in FIG. 8, under the control of a control section 81, the wafer w may be carried first into the topmost pre-cooling unit 15 out of the stacked pre-cooling units 15 in downward order, thus reducing a thermal bad influence upon the cooling processing units 14.

Figure 9:
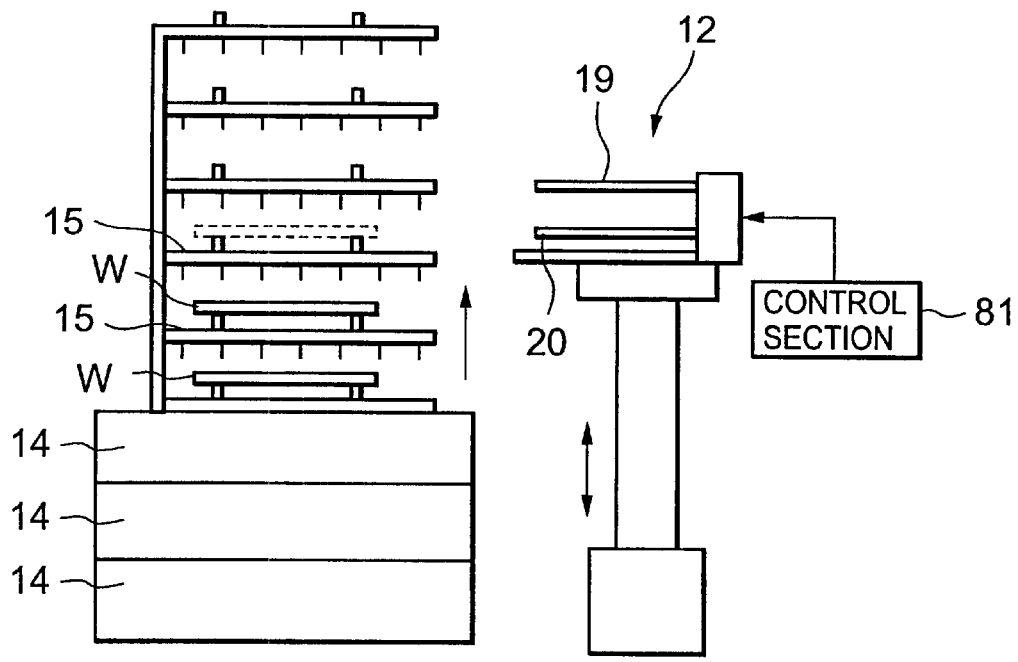
FIG. 9 is a diagram for explaining another transfer control to the pre-cooling units.

As shown in FIG. 9, under the control of the control section 81, the wafer may be carried first into the bottom-most pre-cooling unit 15 out of the stacked pre-cooling units 15 in upward order, thus shortening the transfer distance of the wafer W from the pre-cooling unit 15 to the cooling processing unit 14.

Figure 10:
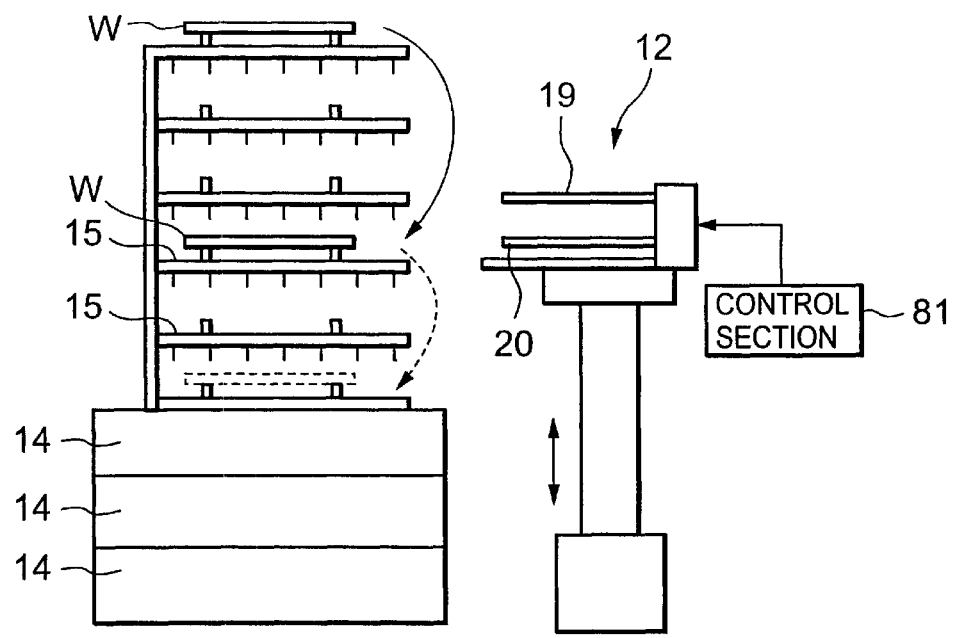
FIG. 10 is a diagram for explaining still another transfer control to the pre-cooling units.

As shown in FIG. 10, under the control of the control section 81, the wafer W may be carried into the pre-cooling unit 15 at a position distant from the pre-cooling unit 15 into which the wafer W is already carried, out of the stacked pre-cooling units 15, thus reducing a mutual thermal bad influence among the pre-cooling units 15.

Figure 11:
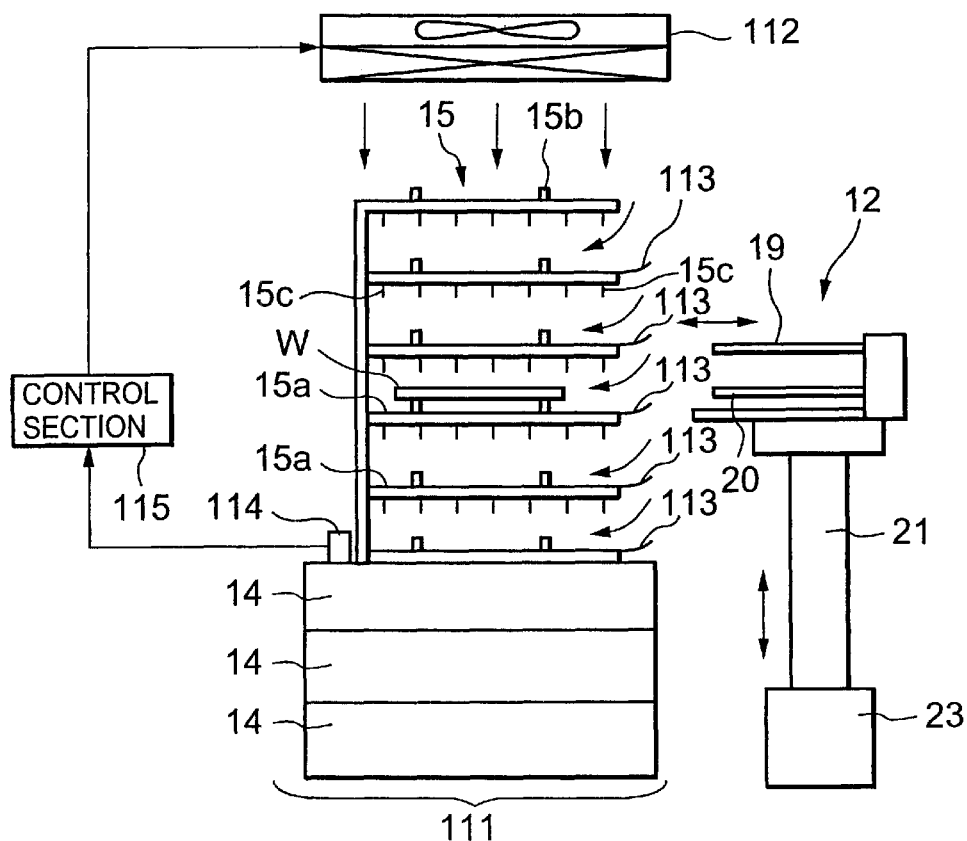
FIG. 11 is a diagram showing still another structural example of the pre-cooling unit.
Figure 12:
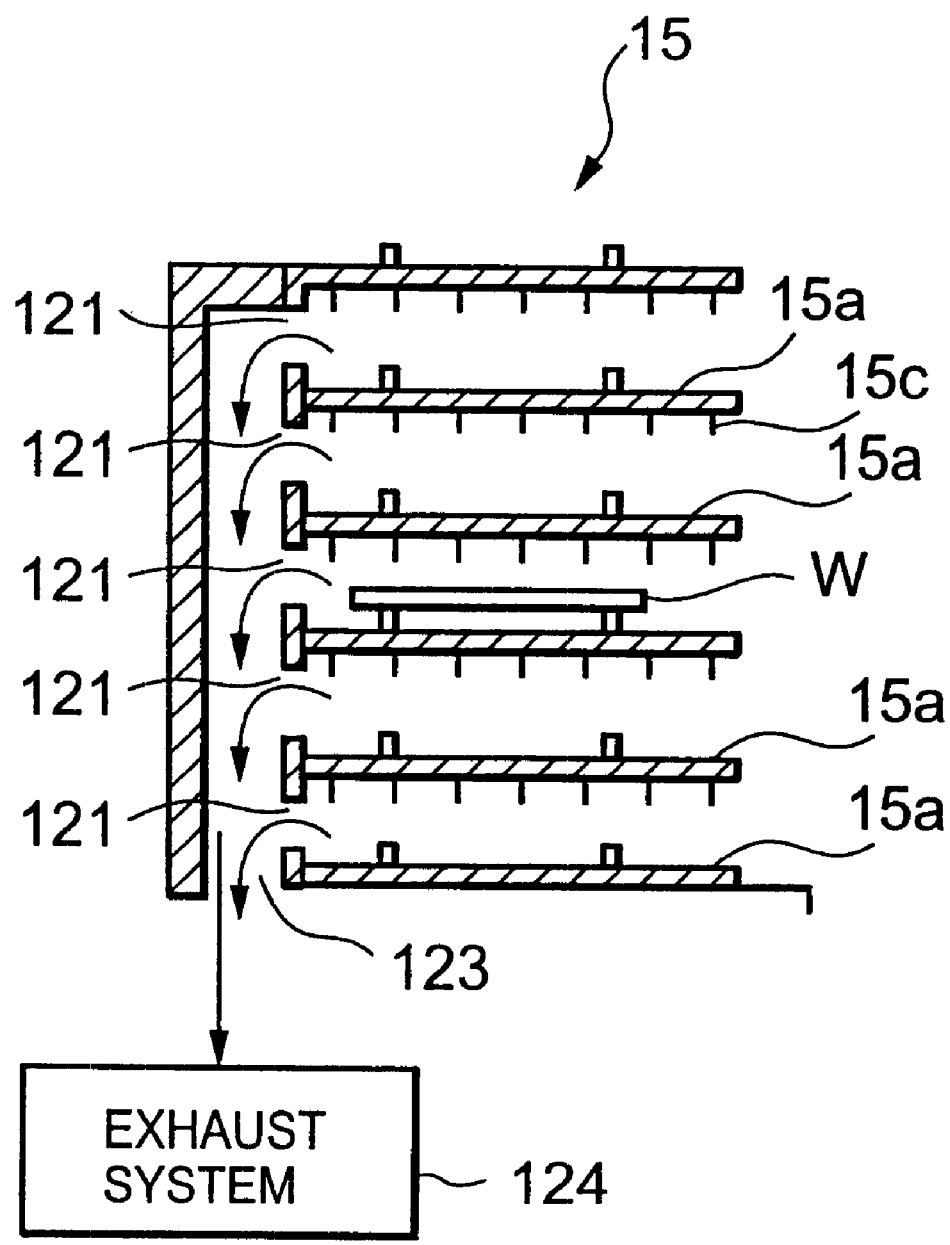
FIG. 12 is a diagram showing yet another structural example of the pre-cooling unit.

When an air supply section 112 for supplying down-flowing clean air onto an area 111 where the pre-cooling units 15 and the cooling processing units 14 are disposed is provided as shown in FIG. 11, an introducing member 113 for introducing the clean air into each of the pre-cooling units 15 is provided at the outer peripheral portion of each pre-cooling unit 15. In this case, as shown in FIG. 11, it is more preferable that the introducing member 113 of the lower pre-cooling unit 15 protrudes further on a plane surface than the introducing member 113 of the upper pre-cooling unit 15, thereby making it possible to cool the wafer W more efficiently in each of the pre-cooing units 15. Moreover, it is suitable that a temperature sensor 114 for detecting the temperature in the area 111 is provided in the area 111 and that a control section 115 controls the supply amount of the clean air to be supplied from the air supply section 112 based on a result detected by the temperature sensor 114. For example, by providing such control that the air supply amount is increased when the temperature in the area 111 rises, efficient temperature control becomes possible.

If an exhaust port 121 for exhausting gas in each of the pre-cooling units 15 is provided at the back of each pre-cooling unit 15 and the gas in each pre-cooling unit 15 is exhausted through an exhaust passage 123 by an exhaust system 124, more efficient cooling in each of the pre-cooling units 15 becomes possible.

Figure 13:
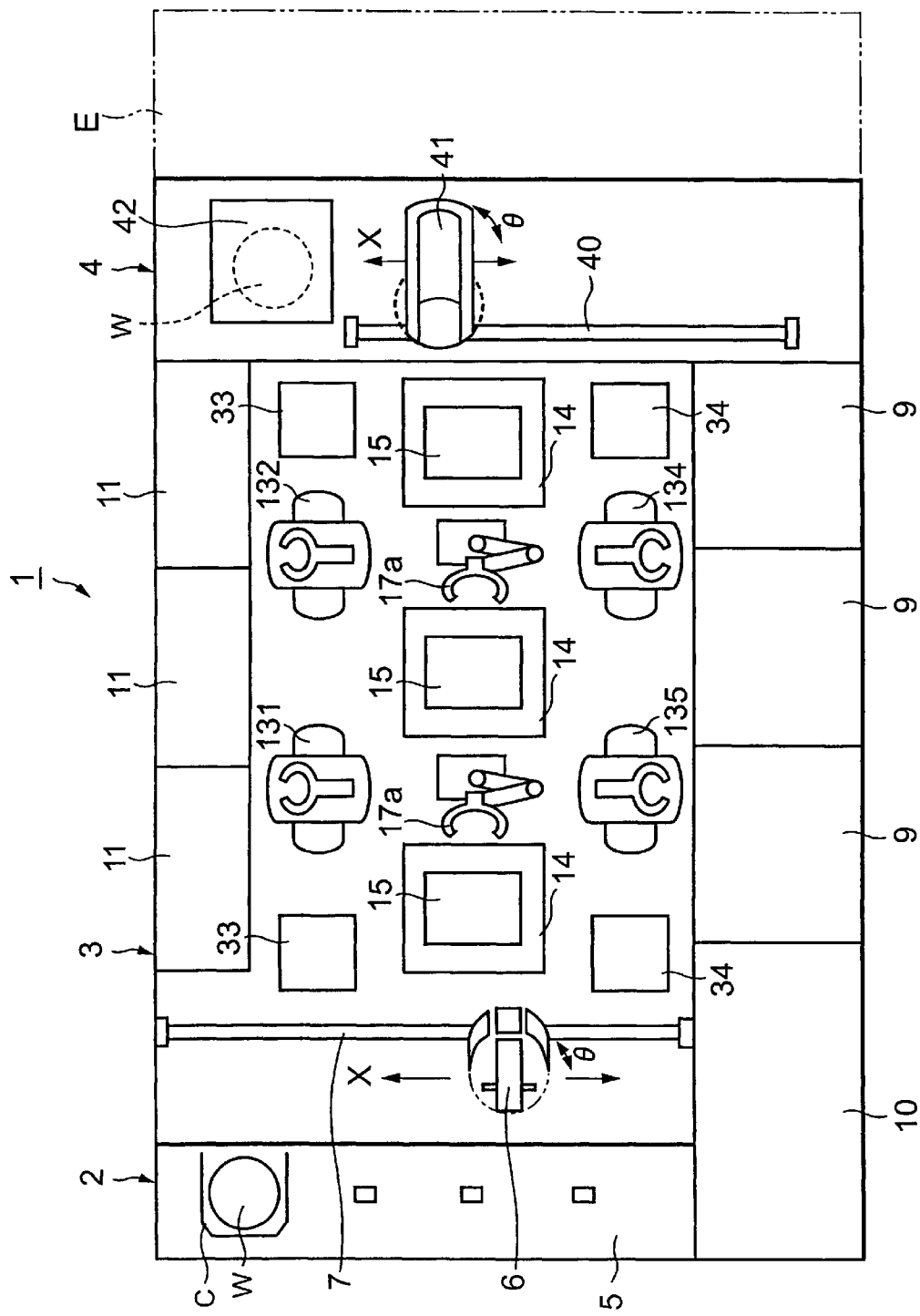
FIG. 13 is a plan view showing another structural example of the substrate processing apparatus according to the present invention.

Although the first transfer machine 12 and the second transfer machine 13 are movable in the Y-direction in the embodiment shown in FIG. 1, vertical transfer-type transfer machines 131 and 132 which do not move in the X-direction nor Y-direction in place of the first transfer machine 12 and similar vertical transfer-type transfer machines 133 and 134 in place of the second transfer machine 13 can be used as shown in FIG. 13. Namely, these vertical transfer-type transfer machines 131 to 134 are transfer machines which are vertically ascendable and descendable, and rotatable in the θ-direction and arms of which can freely get into and withdraw from each unit.

Although the aforesaid embodiment is explained with the given examples in which the wafer W is used as a substrate, the present invention can be applied to cases intended for other substrates such as an LCD substrate, a CD substrate, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing apparatus comprising:
    a solution processing unit configured to supply a processing solution to a substrate for processing the substrate;
    a cooling processing unit configured to subject the substrate to cooling processing to a predetermined temperature;
    a heat processing unit configured to subject the substrate to heat processing; and
    a pre-cooling unit configured to cool the substrate before the substrate is subjected to the cooling processing to the predetermined temperature,
    wherein said pre-cooling unit has an exhaust mechanism configured to forcibly exhaust gas in said pre-cooling unit.

2. The apparatus as set forth in claim 1, further comprising:
    a first transfer machine, a second transfer machine, and a third transfer machine each configured to transfer the substrate,
    said first transfer machine being configured to transfer the substrate between said heat processing unit and said pre-cooling unit,
    said second transfer machine being configured to transfer the substrate between said solution processing unit and said cooling processing unit, and
    said third transfer machine being configured to transfer the substrate between said pre-cooling unit and said cooling processing unit.

3. The apparatus as set forth in claim 1, further comprising:
    a first transfer machine and a second transfer machine each configured to transfer the substrate,
    said first transfer machine being configured to transfer the substrate between said heat processing unit and said pre-cooling unit,
    said second transfer machine being configured to transfer the substrate between said solution processing unit and said cooling processing unit, and at least either one of said first transfer machine or said second transfer machine being configured to transfer the substrate between said pre-cooling unit and said cooling processing unit.

4. The apparatus as set forth in claim 1, further comprising:
a first transfer machine, a second transfer machine, and a third transfer machine each for transferring the substrate,
said heat processing unit and said pre-cooling unit being disposed with said first transfer machine between them,
said solution processing unit and said cooling processing unit being disposed with said second transfer machine between them,
said pre-cooling unit and said cooling processing unit being disposed between said heat processing unit and said solution processing unit,
said first transfer machine being configured to transfer the substrate between said heat processing unit and said pre-cooling unit,
said second transfer machine being configured to transfer the substrate between said solution processing unit and said cooling processing unit, and
said third transfer machine being configured to transfer the substrate between said pre-cooling unit and said cooling processing unit.

5. The apparatus as set forth in claim 1, further comprising:
a first transfer machine and a second transfer machine each configured to transfer the substrate,
said heat processing unit and said pre-cooling unit being disposed with said first transfer machine between them,
said solution processing unit and said cooling processing unit being disposed with said second transfer machine between them;
said pre-cooling unit and said cooling processing unit being disposed between said heat processing unit and said solution processing unit,
said first transfer machine being configured to transfer the substrate between said heat processing unit and said pre-cooling unit,
said second transfer machine being configured to transfer the substrate between said solution processing unit and said cooling processing unit, and
at least either one of said first transfer machine or said second transfer machine being configured to transfer the substrate between said pre-cooling unit and said cooling processing unit.

6. The apparatus as set forth in claim 1,
wherein said pre-cooling unit is put on top of said cooling processing unit.

7. The apparatus as set forth in claim 1,
wherein said pre-cooling unit includes a plate having a supporting member capable of supporting the substrate.

8. The apparatus as set forth in claim 7,
wherein the supporting member has a plurality of supporting pins.

9. The substrate as set forth in claim 7,
wherein the supporting member has a supporter having a supporting surface configured to support a center of the substrate and a portion around the center of the substrate.

10. The apparatus as set forth in claim 1,
wherein said pre-cooling unit has a radiation mechanism for radiating heat of the substrate.

11. The apparatus as set forth in claim 1,
wherein said pre-cooling unit has a fan for sending air toward the substrate.

12. The apparatus as set forth in claim 1,
wherein said pre-cooling unit has a gas jetting section configured to jet cooling gas toward the substrate.

13. The apparatus as set forth in claim 12,
wherein the cooling gas contains inert gas.

14. The apparatus as set forth in claim 1, further comprising pre-cooling units stacked in a plurality of stages.

15. The apparatus as set forth in claim 14, further comprising:
a unit configured to perform such control that the substrate is carried first into a topmost pre-cooling unit out of said pre-cooling units piled up in the plurality of tiers.

16. The apparatus as set forth in claim 14, further comprising:
a unit configured to perform such control that the substrate is carried first into a bottommost pre-cooling unit out of said pre-cooling units piled up in the plurality of tiers.

17. The apparatus as set forth in claim 14, further comprising:
a unit configured to perform such control that the substrate is carried into a pre-cooling unit at a position distant from a previous pre-cooling unit into which the substrate was already carried.

18. A substrate processing apparatus, comprising:
a first section where a solution processing unit configured to supply a processing solution to a substrate for processing the substrate is disposed;
a second section where a heat processing unit configured to subject the substrate to heat processing is disposed;
a third section where a cooling processing unit configured to subject the substrate to cooling processing to a predetermined temperature and a pre-cooling unit configured to cool the substrate before the substrate is subjected to the cooling processing to the predetermined temperature are stacked;
a first substrate transfer machine disposed between said first section and said second section;
a second substrate transfer machine disposed between said second section and said third section; and
an air supply section configured to supply down-flow clean air to said second section,
wherein the pre-cooling unit has an introducing member configured to introduce the clean air into the pre-cooling unit.

19. The apparatus as set forth in claim 18;
wherein the pre-cooling units are stacked in a plurality of stages, and the introducing member of the pre-cooling unit at a lower stage protrudes further on a plane surface than the introducing member of the pre-cooling unit at an upper stage.

20. A substrate processing apparatus, comprising:
a first section where a solution processing unit configured to supply a processing solution to a substrate for processing the substrate is disposed;
a second section where a heat processing unit configured to subject the substrate to heat processing is disposed;
a third section where a cooling processing unit configured to subject the substrate to cooling processing to a predetermined temperature and a pre-cooling unit configured to cool the substrate before the substrate is subjected to the cooling processing to the predetermined temperature are stacked;

a first substrate transfer machine disposed between said first section and said second section;

a second substrate transfer machine disposed between said second section and said third section;

a temperature sensor configured to detect the temperature of said second section; and a control section configured to control a supply amount of clean air to be supplied from said air supply section based on a result detected by said temperature sensor.

* * * * *